(12) United States Patent
Kögler et al.

(10) Patent No.: US 12,439,565 B2
(45) Date of Patent: Oct. 7, 2025

(54) HEAT SINK ASSEMBLY AND POWER CONVERTER ASSEMBLY

(71) Applicant: Siemens Aktiengesellschaft, Munich (DE)

(72) Inventors: Roman Kögler, Nuremberg (DE); Lutz Namyslo, Hausen (DE); Thomas Schwinn, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 205 days.

(21) Appl. No.: 18/032,441

(22) PCT Filed: Aug. 19, 2021

(86) PCT No.: PCT/EP2021/073020
§ 371 (c)(1),
(2) Date: Apr. 18, 2023

(87) PCT Pub. No.: WO2022/083920
PCT Pub. Date: Apr. 28, 2022

(65) Prior Publication Data
US 2024/0032254 A1 Jan. 25, 2024

(30) Foreign Application Priority Data
Oct. 23, 2020 (EP) .................................. 20203605

(51) Int. Cl.
*H05K 7/20* (2006.01)
(52) U.S. Cl.
CPC ..... *H05K 7/20509* (2013.01); *H05K 7/20909* (2013.01)
(58) Field of Classification Search
CPC ... H05K 7/20509; H05K 7/20909; F28F 3/02; F28F 3/06; F28F 3/08
See application file for complete search history.

(56) References Cited

U.S. PATENT DOCUMENTS 5,615,084 A * 3/1997 Anderson ................ F28F 3/12
257/E23.099
9,214,405 B2 * 12/2015 Tsukamoto ........... H01L 23/367
(Continued)

FOREIGN PATENT DOCUMENTS

EP 0340520 11/1989
JP H07249885 9/1995

OTHER PUBLICATIONS

PCT International Search Report dated Nov. 25, 2021 based on PCT/EP2021/073020 filed Aug. 19, 2021.

*Primary Examiner* — Mukundbhai G Patel
(74) *Attorney, Agent, or Firm* — Cozen O'Connor

(57) ABSTRACT

A heat sink assembly for semiconductor components includes a first and second heat sinks, each having a component and cooling fin side, which is provided with cooling fins arranged one behind another such that a cooling medium initially flows in a flow direction through cooling channels formed by the cooling fins of the first heat sink and subsequently flows through cooling channels formed by the cooling fins of the second heat sink, wherein a first inlet cross-section which, on an inlet side of the first heat sink, composed of individual cross-sections of the associated cooling channels of the first heat sink, is reduced via a partition partially covering the cooling channels on the inlet side of the first heat sink, and a second inlet cross-section which, on an inlet side of the second heat sink, is composed of individual cross-sections of the associated cooling channels of the second heat sink.

11 Claims, 7 Drawing Sheets

(56) References Cited

U.S. PATENT DOCUMENTS

| | | | | |
|---|---|---|---|---|
| 2008/0041562 A1* | 2/2008 | Bhatia | ............... | H05K 7/20154 |
| | | | | 257/E23.099 |
| 2012/0014063 A1* | 1/2012 | Weiss | ................ | H05K 7/20909 |
| | | | | 361/697 |
| 2012/0014066 A1* | 1/2012 | Morino | ............. | H05K 7/20509 |
| | | | | 165/185 |
| 2014/0014308 A1 | 1/2014 | Wu et al. | | |

* cited by examiner

HEAT SINK ASSEMBLY AND POWER CONVERTER ASSEMBLY

CROSS-REFERENCE TO RELATED APPLICATIONS

This is a U.S. national stage of application No. PCT/EP2021/073020 filed 19 Aug. 2021. Priority is claimed on European Application No. 20203605.9 filed 23 Jul. 2020, the content of which is incorporated herein by reference in its entirety.

BACKGROUND OF THE INVENTION

1. Field of the Invention

The invention relates to a heat sink assembly for a plurality of semiconductor components comprising a first heat sink and a second heat sink each having a component side and a cooling fin side equipped with cooling fins arranged in series such that a coolant flows in a direction of flow first through cooling channels formed by the cooling fins of the first heat sink and then flows through cooling channels formed by the cooling fins of the second heat sink.

The invention also relates to a heat sink assembly with more than two such heat sinks arranged in series.

Furthermore, the invention relates to a power converter assembly for supplying an electrical machine comprising the heat sink assembly mentioned in the introduction.

2. Description of the Related Art

In practice, it is known and customary to use heat sinks for cooling semiconductor components.

EP 0 340 520 B1 discloses an assembly for convection cooling of components, which has a heat sink composed of two parts arranged one above the other.

For manufacturing reasons and due to a simpler structural design or a space-saving assembly, such as in power converter assemblies, in particular of an inverter, the semiconductor components required for actuating a motor are often arranged on a common heat sink for heat dissipation. These semiconductor components are placed one after the other with respect to a direction of a coolant flow, resulting in a thermal series connection. This thermal series connection leads to a decreasing cooling effect the further away the respective semiconductor component to be cooled is located from an inlet of the coolant.

SUMMARY OF THE INVENTION

It is an object of the invention to provide an assembly for cooling semiconductor components in which the temperature of a coolant is still sufficient even if the components to be cooled are located further away from an inlet, in order to thereby provide sufficient cooling capacity for the component that is located further away from the inlet.

This and other objects and advantages are achieved in accordance with the invention by a heat sink assembly in which a first inlet cross section which, on an inlet side of the first heat sink, is composed of individual cross sections of the associated cooling channels of the first heat sink, is reduced via a partition that at least partially covers the cooling channels on the inlet side of the first heat sink, in comparison with a second inlet cross section which, on an inlet side of the second heat sink, is composed of individual cross sections of the associated cooling channels of the second heat sink.

Parallel connection of the two heat sinks is not possible for reasons of compatibility, for example, in existing inverter ranges with a defined customer interface. As a result, the two heat sinks are connected in series. The first heat sink could be referred to as the thermally cooler heat sink and the second heat sink can be referred to as the thermally warmer heat sink.

In accordance with the invention, partial thermal decoupling of individual cooling interspaces is applied to the cooler heat sink, as a result of which its overall cooling capacity is degraded. At the same volume flow, for example, through a fan with forced convection, pressure in a reservoir of the fan increases and the volume flow in the remaining "open" cooling channels is increased. The coolant flowing out of the cooler heat sink is now cooler than in a conventional series connection in which no partition means is used in the first heat sink. Consequently, the static temperature increases in the first heat sink. This corresponds to a "deterioration" of the heat dissipation of the heat sink equipped with, for example, a plastic comb. The plastic does not have to completely close the cooling fins, partial breaks in the comb, holes, are also conceivable.

Segmental partial partitioning of a cooling channel via, for example, tapered inserts over the entire length of the fin is also conceivable. This measure enables a number of active cooling fins participating in the cooling to be influenced.

In a particularly advantageous embodiment of the heat sink assembly, an interspace, which is covered by a cover, is arranged between the first heat sink and the second heat sink, where the interspace and the cover form a turbulence chamber.

Individual flows from the cooling channels of the first heat sink can now swirl in the interspace and flow into the cooling channels, which are generally completely open, to form new flows for the second heat sink. The interspace and its cover function as a type of diffusor for the coolant. In order to provide the second series-connected heat sink with the coolant flowing out of the first heat sink uniformly over all cooling fins or cooling channels, the antechamber is required to ensure the turbulence and uniform distribution of the coolant.

In a further advantageous embodiment, the partition is formed as a comb for insertion into the inlet side of the first heat sink.

Turbulence and/or guidance elements are arranged in the interspace for improved turbulence. The interspace can be covered by inserting a plastic part between the two heat sinks. This interspace serves to uniformly distribute the coolant to the other cooling channels of the second heat sink. In an advantageous embodiment, the plastic part can be formed with an internal structure that takes over the necessary optimal turbulence and coolant deflection. Turbulence elements could, for example, be formed as flow baffles or in an airfoil shape or as a spoiler.

The objects in accordance with the invention are also achieved by a power converter assembly for supplying an electrical machine. Here, the power converter assembly comprises a heat sink assembly for a plurality of semiconductor components comprising a first heat sink and a second heat sink each having a component side and a cooling fin side equipped with cooling fins, which are arranged in series such that a coolant initially flows in a direction of flow through the cooling channels formed by the cooling fins of the first heat sink and then subsequently flows through the cooling channels formed by the cooling fins of the second heat sink. Here, a first inlet cross section which, on an inlet side of the first heat sink, is composed of individual cross sections of the associated cooling channels of the first heat sink, is reduced via a partition, which at least partially covers the cooling channels on the inlet side of the first heat sink, in comparison with a second inlet cross section which, on an inlet side of the second heat sink, is composed of individual cross sections of the associated cooling channels of the second heat sink.

In order to further improve the heat dissipation of the assembly, an interspace, which is covered by a cover, is arranged between the first heat sink and the second heat sink, where the interspace and the cover form a turbulence chamber.

Particularly with respect to inverters for controlling electrical machines, the power converter assembly is intended for vertical installation in a switchgear cabinet, where a longitudinal axis of the heat sink assembly is arranged vertically and thus the direction of flow through the power converter assembly is parallel to the longitudinal axis and an inlet for a coolant is arranged at the bottom on the inlet side of the first sink and an outlet for the coolant is arranged at the top above the outlet side opposite the inlet side of the second heat sink.

Advantageously, power converter assemblies with such a structural embodiment now no longer require an additional bypass for the heat sink assembly, where this additional bypass would only reduce the remaining available device volume, which is preferably needed to accommodate electronic and mechanical components. Consequently, the installation space required is now available for further device components, such as fuses or DC link capacitors.

The previously used expensive bypass components are no longer required and the configuration of a power converter assembly is simplified with respect to both configuration and installation. Depending on the embodiment of the partition or insertion comb (number of closed cooling channels) and the reservoir between the heat sinks, the heat dissipation of the two series-connected heat sinks can be optimized such that both heat sinks reach approximately the same temperature during operation. This leads to an increase in the service life of the power converter assembly since, without the aforementioned measures, the thermally warmer heat sink determines the service life of the semiconductor components. Cost reduction due to the use of possibly smaller power semiconductors would also be conceivable, since the semiconductor clips no longer must be adapted for the hotter heat sink in the air duct with the secondary flow.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment, in which.

DETAILED DESCRIPTION OF THE EXEMPLARY EMBODIMENTS

Figure 1:
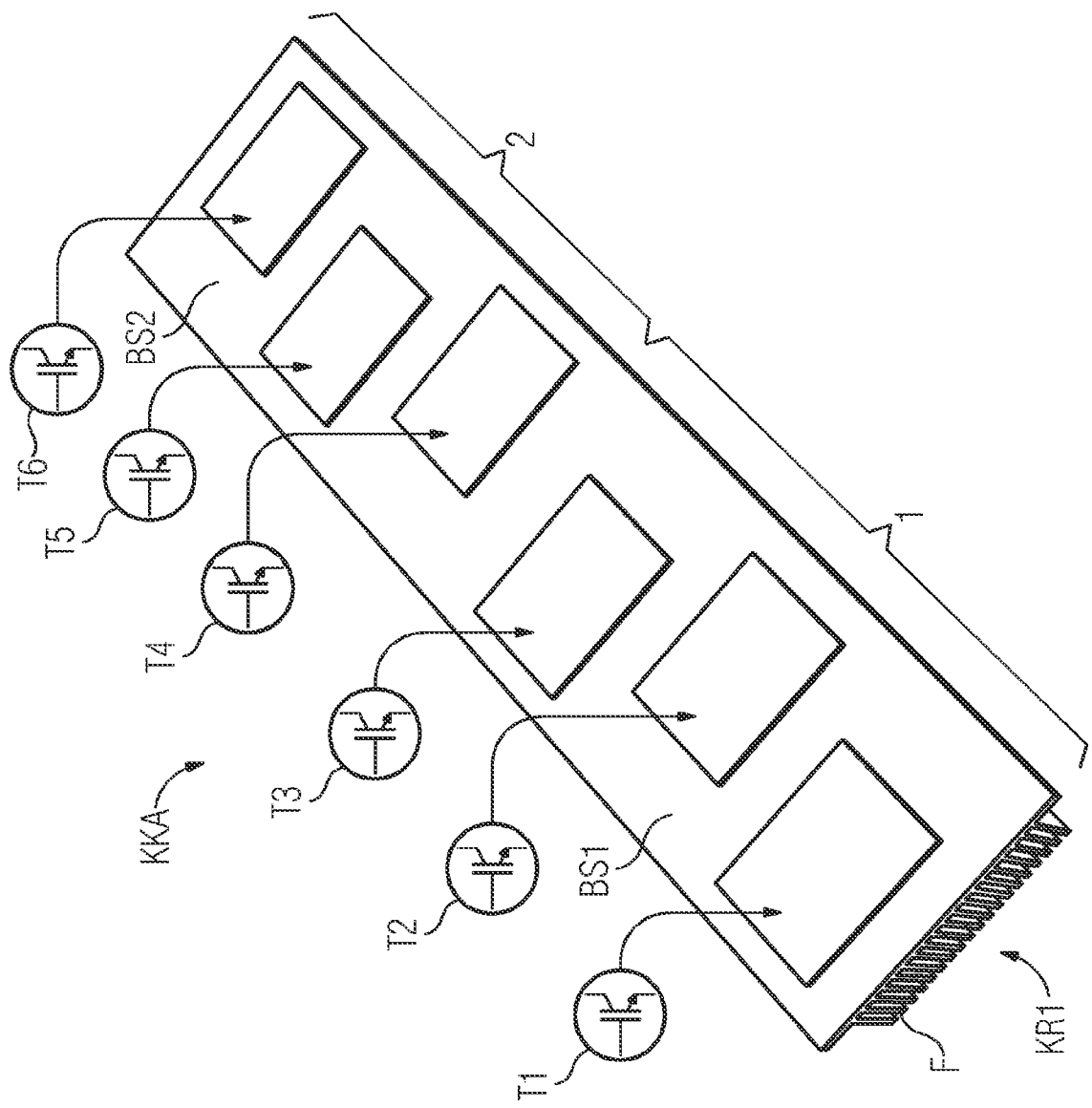
FIG. 1 is a perspective view of a heat sink assembly for cooling semiconductor components in accordance with the invention.

FIG. 1 shows a heat sink assembly KKA for a plurality of semiconductor components T1, . . . , T6. The heat sink assembly KKA comprises a first heat sink 1 and a second heat sink 2 each having a component side BS1,BS2 upon which the semiconductor components T1, . . . , T6 can be placed for cooling. Opposite each of the component sides BS1,BS2 is a cooling fin side KR1,KR2 equipped with cooling fins F. The cooling fins F are arranged in series such that a coolant 11 initially flows in a direction of flow 10 according to FIG. 2 through the cooling channels K1*i* formed by the cooling fins F of the first heat sink 1 and then subsequently flows through the cooling channels K2*i* formed by the cooling fins F of the second heat sink 2.

Figure 2:
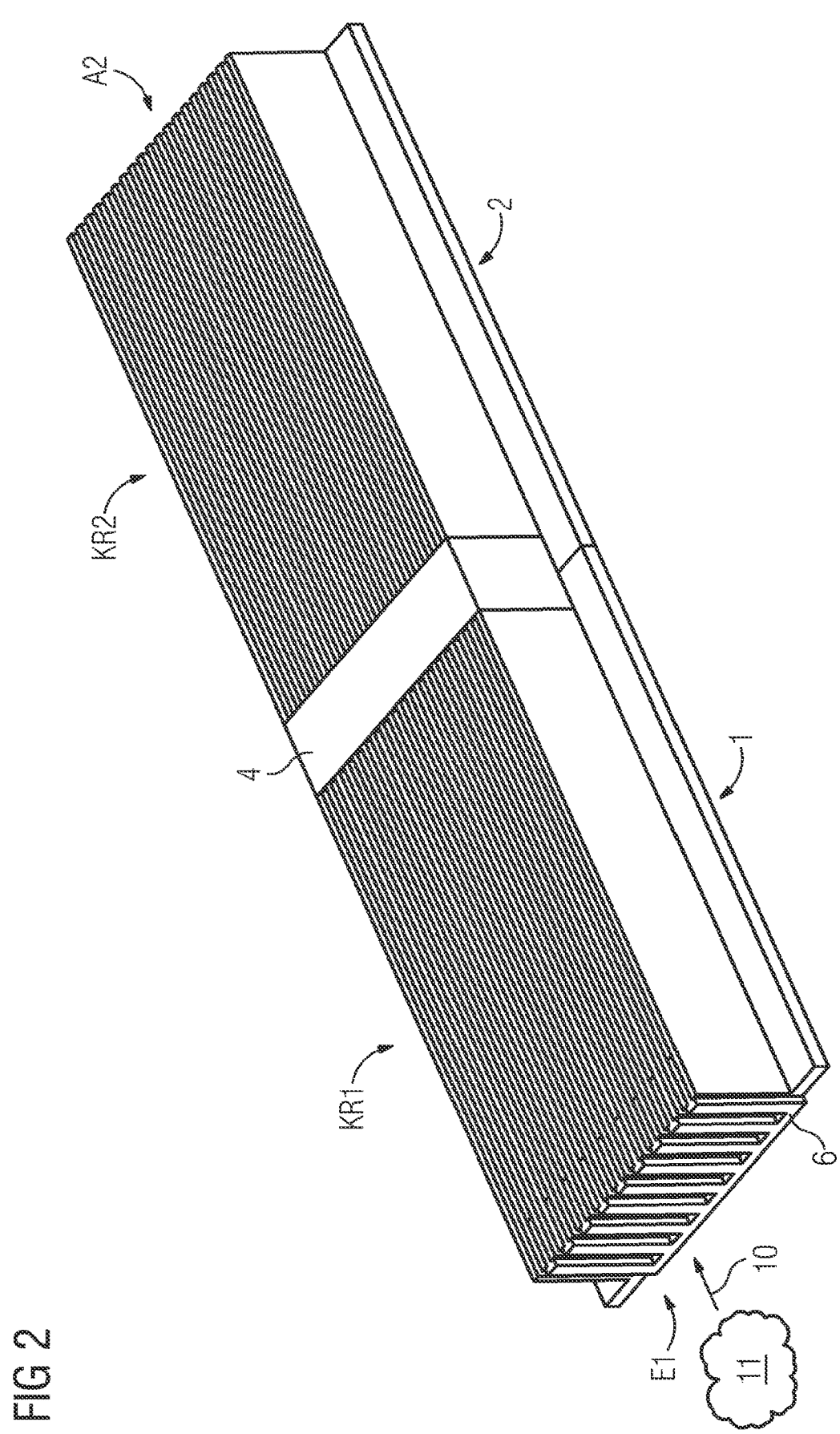
FIG. 2 is another perspective view of the heat sink assembly of FIG. 1 with a top view of a cooling fin side.

FIG. 2 shows the heat sink assembly KK1 looking at the cooling fin sides KR1,KR2.

The coolant 11 can enter the heat sink assembly KKA at a first inlet side E1 and exit again via an outlet side A2 of the second heat sink 2. A cover 4 provides a fluidic connection between the two heat sinks 1,2. A comb 6 reduces the cross section of the first inlet side E1.

Figure 3:
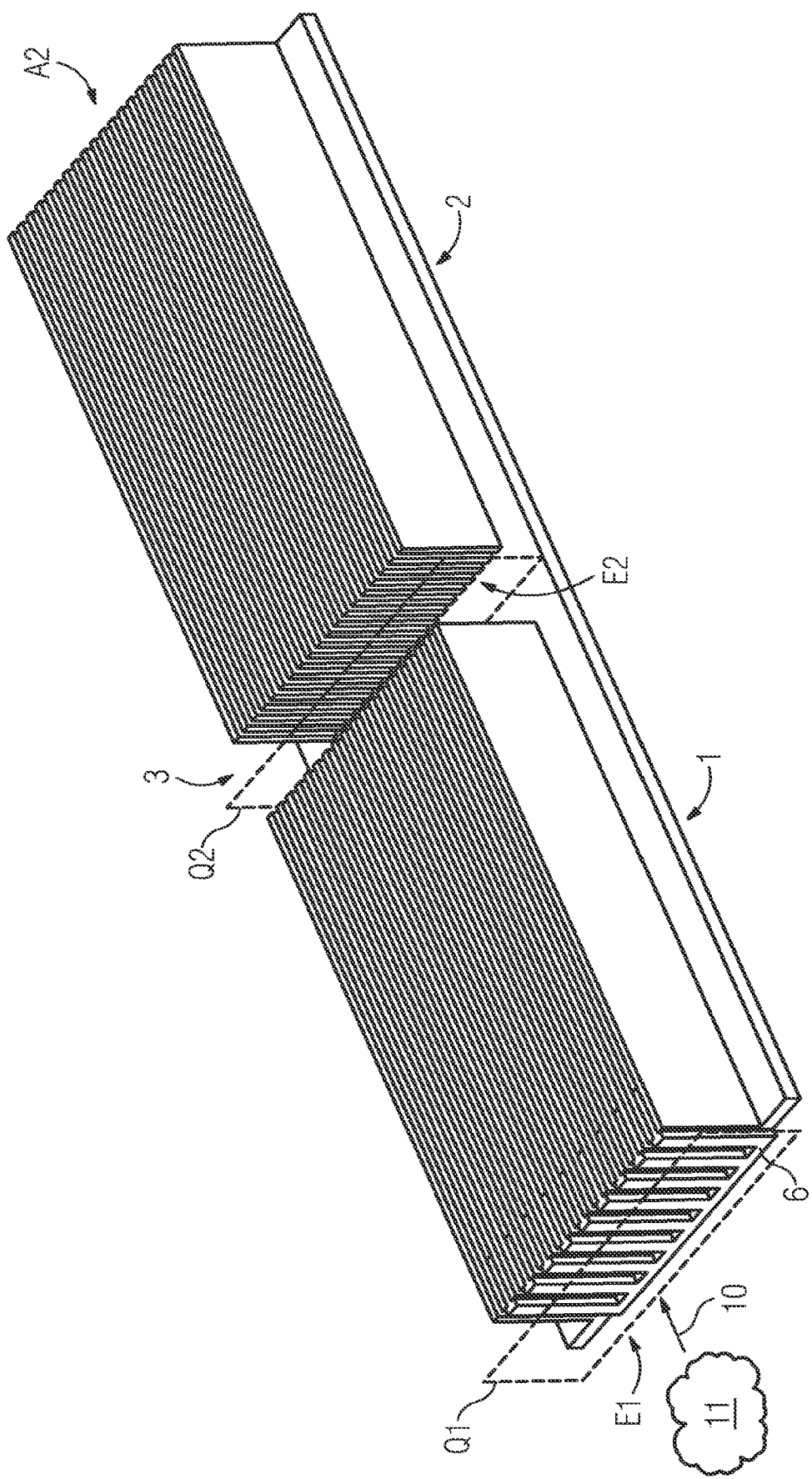
FIG. 3 is an illustration of the heat sink assembly of FIG. 2 with the focus on an interspace.

FIG. 3 shows a first inlet cross section Q1 which, on the inlet side E1 of the first heat sink 1, is composed of individual cross sections EQK1*i* of the associated cooling channels K1*i* of the first heat sink. The first inlet cross section Q1 is reduced via the comb 6, which at least partially covers the cooling channels K1*i* on the inlet side E1 of the first heat sink 1, in comparison with a second inlet cross section Q2 (see FIG. 3) which, on an inlet side E2 of the second heat sink 2, is composed of individual cross sections EQK2*i* of the associated cooling channels K2*i* of the second heat sink 2.

As shown in FIG. 3, an interspace 3 is arranged between the first heat sink 1 and the second heat sink 2. The interspace 3 is covered by a cover 4 as shown in FIG. 2. The interspace 3 and the cover 4 form a turbulence chamber. The covered interspace 3 serves to provide uniform distribution of the coolant 11 to all cooling channels K2*i* of the second heat sink 2.

Figure 4:
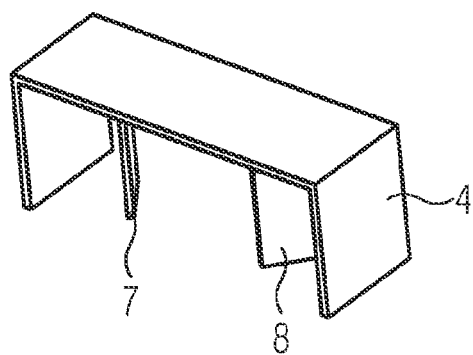
FIG. 4 is an illustration of a cover for the interspace of FIG. 3.
Figure 5:
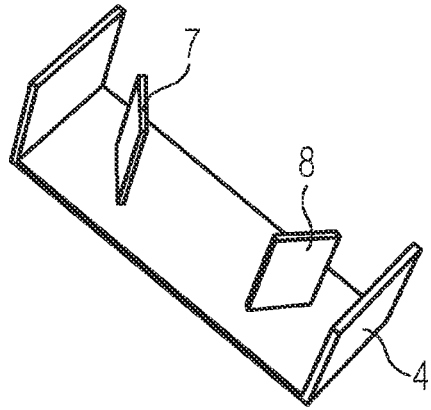
FIG. 5 is an illustration of the cover of FIG. 4 in another perspective view.

FIG. 4 and FIG. 5 show the cover 4, where the cover 4 is provided with a first guidance element 7 and a second guidance element 8.

Figure 6:
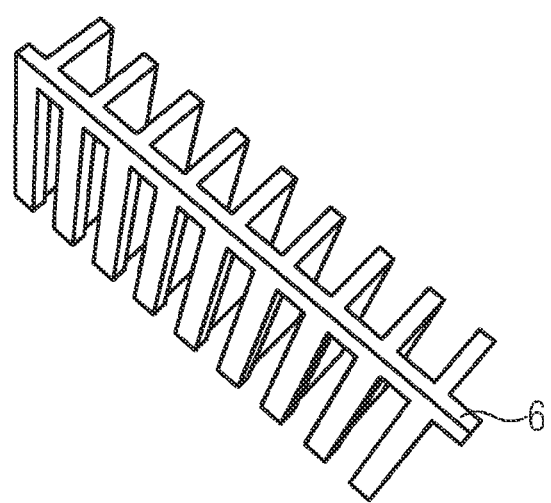
FIG. 6 is an illustration of a comb as a partition.

FIG. 6 depicts the partition the form of a comb 6. The individual comb elements are structured such that they fit exactly into the interspace between two cooling fins F and hence can partition a cooling channel.

Figure 7:
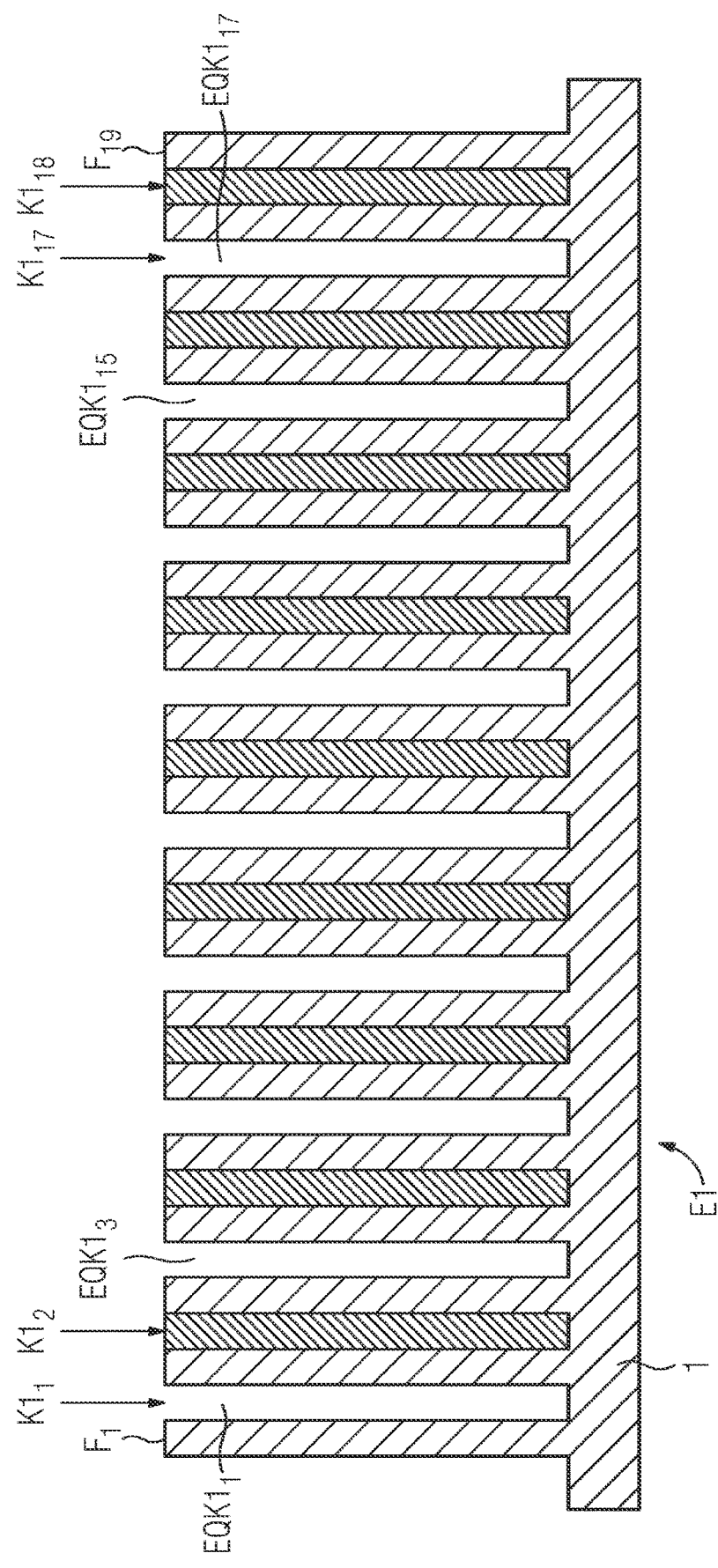
FIG. 7 is an elucidation of the effective inlet cross sections in accordance with the invention.

FIG. 7 illustrates the reduction of the first inlet cross section Q1 compared to the second inlet cross section Q2. When looking at the cooling fins F1, . . . , F19 of the first heat sink 1, the respective cooling channels $K1_1, K1_2, \ldots, K1_{17}, K1_{18}$ can also be seen. The comb 6, which is inserted into the cooling channels $K1i$, closes each of the cooling channels $K1i$ with an even index. The cooling channels $K1i$ with an odd index remain open. Consequently, the following relationship is obtained for a first inlet cross section Q1

$$Q1 = \sum_{1 \leq i \leq 9} EQK1(2i-1)$$

and, for a second inlet cross section of the second heat sink 2 lying behind this in which none of the cooling channels $K2i$ is closed, the following relationship is obtained for the second inlet cross section Q2

$$Q2 = \sum_{1 \leq i \leq 18} EQK2(i)$$

Figure 8:
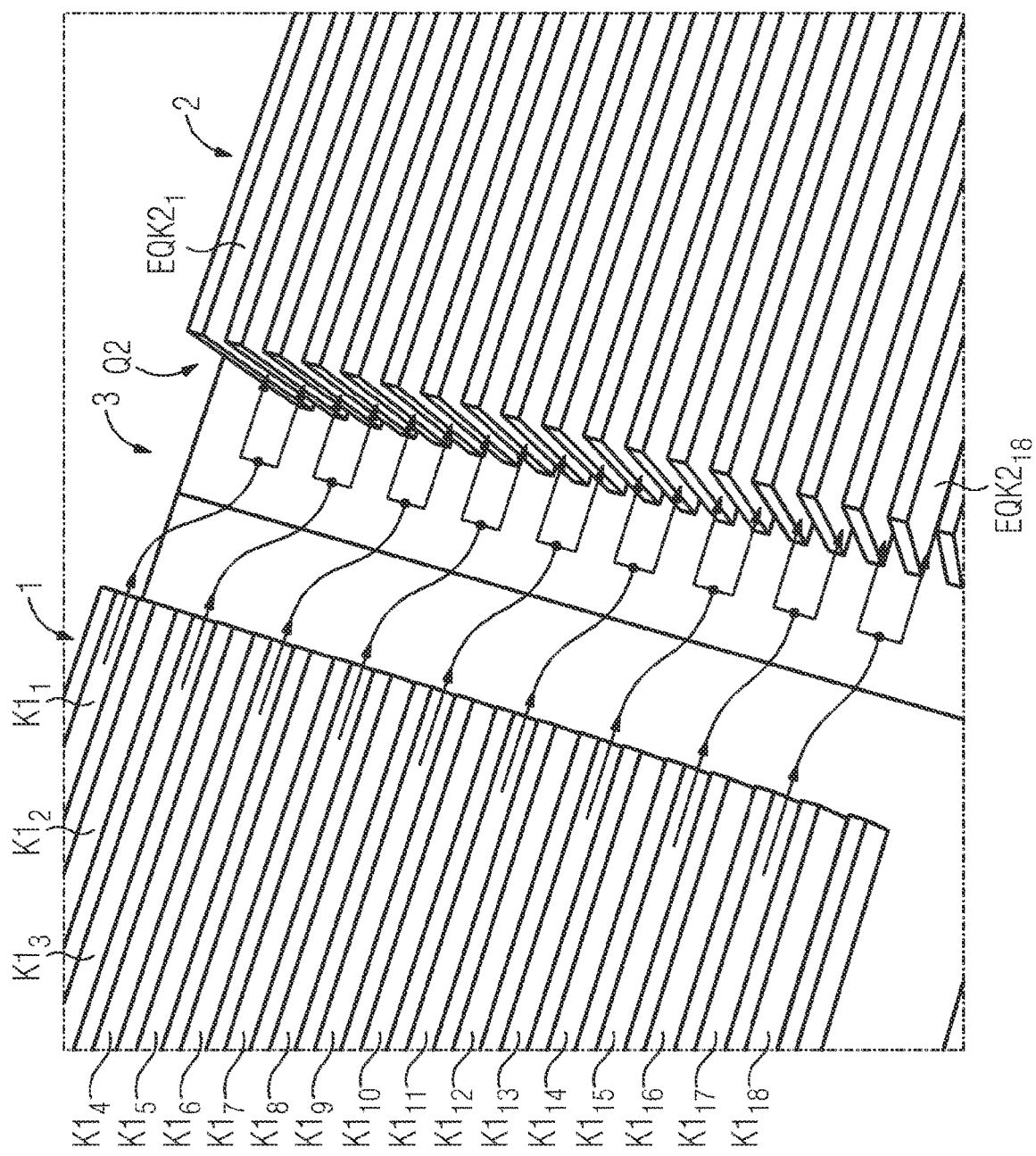
FIG. 8 is an elucidation of the turbulence of flow lines in the interspace in accordance with the invention.

FIG. 8 illustrates the aforementioned turbulence of the flow of the coolant 11 into the interspace 3. Due to the comb 6 inserted on the inlet side E1 of the first heat sink 1, a partial coolant flow can only flow out of the cooling channels $K1i$ with an odd index. The resulting nine outflowing partial flows are then distributed to the cooling channels $K2i$ of the second heat sink 2 through which the coolant 11, which has not yet heated up completely in the first heat sink, then flows completely.

Figure 9:
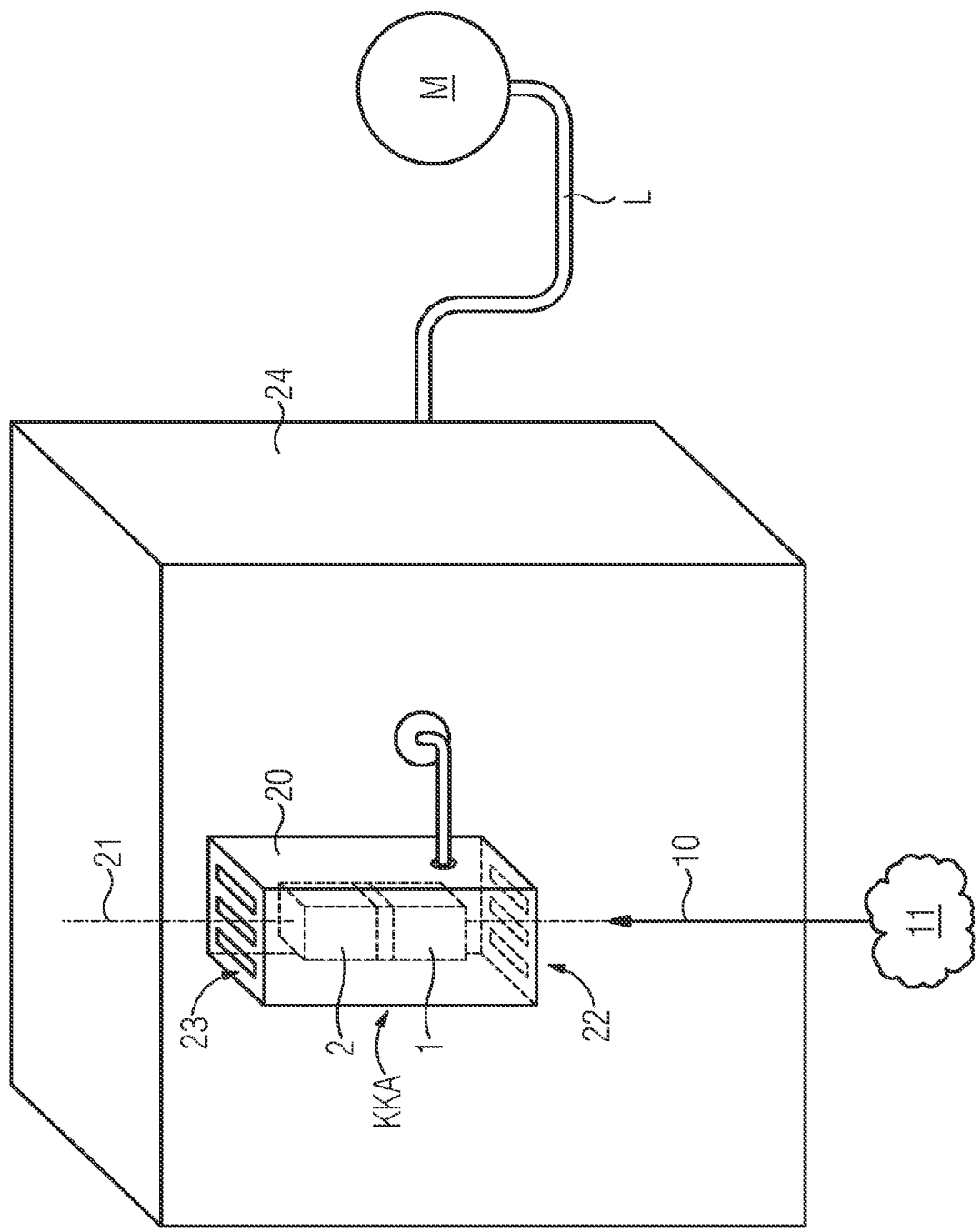
FIG. 9 is an illustration of a power converter assembly in a switchgear cabinet in accordance with the invention.

FIG. 9 shows a power converter assembly 20 for supplying an electrical machine M in a switchgear cabinet 24. A longitudinal axis 21 of the power converter assembly 20 or the internally integrated heat sink assembly KKA is arranged vertically and thus the direction of flow 10 through the power converter assembly 20 is parallel to the longitudinal axis 21 and an inlet 22 for the coolant 11 is arranged at the bottom and an outlet 23 for the coolant 11 is arranged at the top. In the power converter assembly 20, a first heat sink 1 and a further, substantially identical, heat sink 2 for cooling the components are arranged in series in the direction of flow 10. The power converter assembly 20 can control the motor M via a line L.

The use of the heat sink assembly KKA in accordance with the invention, where the inlet cross section Q1 in the first heat sink 1 has been reduced by a partition, advantageously enables such a power converter assembly 20 to be formed with small structural dimensions, because it is possible to efficiently dissipate heat from the series-connected semiconductor components T1, . . . , T6, with the heat sink assembly KKA in accordance with the invention.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A heat sink assembly for a plurality of semiconductor components, the heat sink assembly comprising:
a first heat sink; and
a second heat sink the first and second heat sinks each having a component side and a cooling fin side equipped with cooling fins arranged in series such that a coolant initially flows in a direction of flow through cooling channels formed by the cooling fins of the first heat sink and subsequently flows through cooling channels formed by the cooling fins of the second heat sink;
an interspace; and
a cover which covers the interspace, the cover including a first guidance element and a second guidance element which are disposed within the interspace;
wherein a first inlet cross section which, on an inlet side of the first heat sink, is composed of individual cross sections of the associated cooling channels of the first heat sink, is reduced via a partition, which at least partially covers the cooling channels on the inlet side of the first heat sink in comparison with a second inlet cross section, which, on an inlet side of the second heat sink, is composed of individual cross sections of the associated cooling channels of the second heat sink.

2. The heat sink assembly as claimed in claim 1, wherein the interspace and the cover form a turbulence chamber.

3. The heat sink assembly as claimed in claim 2, wherein the partition is formed as a comb for insertion into the inlet side of the first heat sink.

4. The heat sink assembly as claimed in claim 2, wherein turbulence and/or guidance elements are arranged in the interspace.

5. The heat sink assembly as claimed in claim 1, wherein the partition is formed as a comb for insertion into the inlet side of the first heat sink.

6. The heat sink assembly as claimed in claim 5, wherein turbulence and/or guidance elements are arranged in the interspace.

7. A power converter assembly for supplying an electrical machine comprising:
a heat sink assembly for a plurality of semiconductor components comprising a first heat sink and a second heat sink, the first and second heat sinks each having a component side and a cooling fin side equipped with cooling fins arranged in series such that a coolant initially flows in a direction of flow through cooling channels formed by the cooling fins of the first heat sink and subsequently flows through cooling channels formed by the cooling fins of the second heat sink;
wherein a first inlet cross section which, on an inlet side of the first heat sink, composed of individual cross sections of the associated cooling channels of the first heat sink, is reduced by a partition which at least partially covers the cooling channels on the inlet side of the first heat sink in comparison with a second inlet cross section, which, on an inlet side of the second heat sink, is composed of individual cross sections of the associated cooling channels of the second heat sink;
wherein an interspace, which is covered by a cover, is arranged between the first heat sink and the second heat sink, the cover including a first guidance element and a second guidance element which are disposed within the interspace.

8. The power converter assembly as claimed in claim 7, wherein an interspace which is covered by a cover, is arranged between the first heat sink and the second heat sink; and wherein the interspace and the cover form a turbulence chamber.

9. The power converter assembly as claimed in claim 8, wherein the power converter is vertically oriented when installed in a switchgear cabinet, and wherein a longitudinal axis of the heat sink assembly is arranged vertically such that the direction of flow through the power converter assembly is parallel to the longitudinal axis and an inlet for a coolant is arranged at the bottom on the inlet side of the first heat sink and an outlet for the coolant is arranged at the top above the outlet side opposite the inlet side of the second heat sink.

10. The power converter assembly as claimed in claim 7, wherein the power converter is vertically oriented when installed in a switchgear cabinet, and wherein a longitudinal axis of the heat sink assembly is arranged vertically such that the direction of flow through the power converter assembly is parallel to the longitudinal axis and an inlet for a coolant is arranged at the bottom on the inlet side of the first heat sink and an outlet for the coolant is arranged at the top above the outlet side opposite the inlet side of the second heat sink.

11. The power converter assembly as claimed in claim 7, wherein the interspace and the cover form a turbulence chamber.

* * * * *